United States Patent [19]
Kosky et al.

[11] Patent Number: 5,391,229
[45] Date of Patent: Feb. 21, 1995

[54] APPARATUS FOR CHEMICAL VAPOR DEPOSITION OF DIAMOND INCLUDING GRAPHITE SUBSTRATE HOLDERS

[75] Inventors: Philip G. Kosky, Schenectady, N.Y.; David E. Slutz, Columbus; Friedel S. Knemeyer, Granville, both of Ohio

[73] Assignee: General Electric Company, Schenectady, N.Y.

[21] Appl. No.: 96,392

[22] Filed: Jul. 26, 1993

[51] Int. Cl.$^6$ .................................................. B05C 5/00
[52] U.S. Cl. ............................ 118/500; 118/728; 264/81; 428/408; 428/469; 432/156; 432/264; 432/265
[58] Field of Search ............... 118/728, 500; 264/81; 428/408, 469; 432/264, 265, 156

[56] References Cited

U.S. PATENT DOCUMENTS

| | | | |
|---|---|---|---|
| 5,082,359 | 1/1992 | Kirkpatrick | 264/81 |
| 5,204,145 | 4/1993 | Gasworth | 264/81 |
| 5,221,501 | 6/1993 | Feldman et al. | 264/81 |
| 5,294,381 | 3/1994 | Iguchi et al. | 264/81 |

*Primary Examiner*—Timothy M. MaMahon
*Attorney, Agent, or Firm*—William H. Pittman

[57] ABSTRACT

Graphite substrate holders for employment in apparatus for chemical vapor deposition of diamond decrease the tendency of the formed diamond sheets to crack or shatter upon separation from the substrates. Said holders and the substrates therein preferably have rounded edges, to suppress crack formation at sharp corners. The holders are preferably coated, at least in part, with a tie-layer and a hydride-forming metal such as niobium. Also, certain maximum distances between the edges of the holder and substrates are preferably maintained in order to prevent contact of diamond with a heated filament employed for thermal activation.

13 Claims, 1 Drawing Sheet

APPARATUS FOR CHEMICAL VAPOR DEPOSITION OF DIAMOND INCLUDING GRAPHITE SUBSTRATE HOLDERS

This invention relates to the chemical vapor deposition of diamond. More particularly, it relates to the design of holders for substrates on which such diamond is deposited, said holders being adapted to easy release of diamond sheets formed on such substrates.

The chemical vapor deposition (hereinafter sometimes "CVD") of diamond on a substrate, said diamond being produced by thermal or non-thermal activation of a mixture of hydrogen and a hydrocarbon at low pressure, is under continuing development in attempts to facilitate the production of diamond sheets which can be easily removed from the substrate. Such sheets could then be cut into diamond articles to be used, for example, as heat sinks in electronic devices. Diamond heat sinks would be particularly useful by reason of the high thermal conductivity of diamond.

The preparation of free-standing diamond sheet for fabrication of products such as heat sinks is typically done in a CVD diamond apparatus in which thermal activation is achieved by at least one hot filament. A number of substrates, typically square or rectangular having relatively unimpeded edges are typically secured in said apparatus. For example, the substrates may be held by metal tabs in openings in a metal sheet, said openings being slightly larger than the substrates. Alternatively, the substrates may be fitted with metal pegs and hung from slotted beams. The use of substrate holders of this type ensures free circulation of the reactant gases and efficient contact of the heated filament and substrate surfaces thereby.

A problem routinely encountered, however, is cracking or shattering of the diamond sheets when the sheets and the substrates on which they are formed are cooled subsequent to diamond deposition. There is inevitably a difference, often substantial, between the coefficient of thermal expansion of the substrate and that of the diamond sheet. As a result, fracture of the sheet occurs unless the sheet is capable of clean separation from the substrate upon cooling.

Such clean release is impeded when the edges of rectangular substrates remain free, for at least two reasons. First, the deposited diamond tends to curl around the edges of the substrates rather than forming only on the front surface thereof, making clean release impossible. Second, compounding of stresses occurs at the corners of the substrate, resulting in the initiation of cracks which then propagate throughout the diamond sheet.

For employment in many heat sink applications, such as for mounting diodes, very small pieces of diamond are adequate. Thus, it is frequently possible to isolate numerous heat sink units from a diamond sheet even when cracking has occurred. The sheet may, however, become totally unuseable if shattering occurs. Moreover, it would be highly desirable to maximize the area of diamond convertible to heat sink units by minimizing or entirely eliminating cracking.

The present invention provides holders for CVD diamond substrates which are very effective at suppressing the above-described crack formation in and shattering of the diamond sheets formed on the substrates. Said suppression may extend to one or both of the failure modes described hereinabove, by curling of the diamond sheet around the edge of the substrate or stress compounding at corners.

In one of its aspects, the invention is apparatus for receiving diamond produced by chemical vapor deposition, said apparatus comprising:

at least one substrate holder comprising graphite, said substrate holder having at least one recess adapted to hold a substrate such that the surface of said substrate is flush with the surface of said holder surrounding said recess; and at least one substrate mounted in said recess, said substrate comprising a material effective to receive and subsequently release a layer of said diamond.

BRIEF DESCRIPTION OF THE DRAWINGS

The drawings constitute two views of an illustrative apparatus according to the invention.

Figure 1:
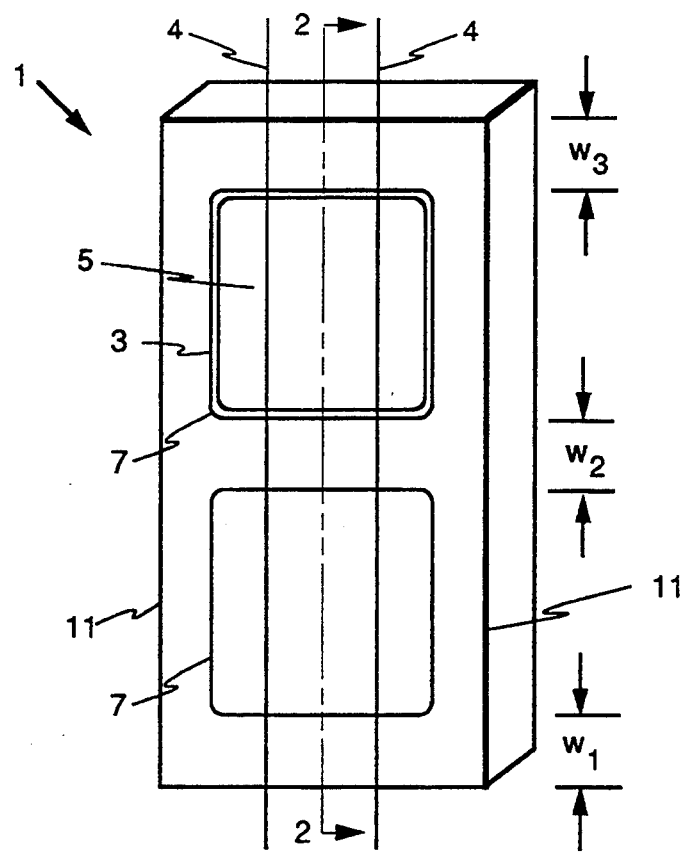
FIG. 1 is a front view and FIG. 2 a cross-sectional view taken along the line 2—2 of FIG. 1.
Figure 2:
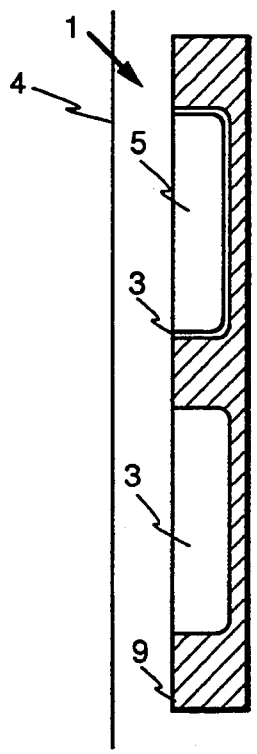

Referring now to the drawings, there is shown a substrate holder 1 adjacent to heated filaments 4 for thermal activation. Said filaments are parallel to each other and to the surface 9 of the substrate holder; they may be horizontal or vertical. If horizontal filaments are employed, they are preferably in a horizontal plane and the substrates and substrate holders are preferably also horizontal and located beneath the filaments.

Two filaments are shown, but it is within the scope of the invention to employ one or more than one filament per substrate holder. Typical filament materials are tungsten, tantalum, molybdenum and rhenium, with tungsten often being preferred. It is also contemplated to employ non-thermal means, such as microwave or plasma radiation, for activation of the diamond-producing gases.

Substrate holder 1 is shown as having two recesses 3 for substrates. For the sake of clarity, a substrate 5 is shown in only one of said recesses, although all recesses will normally contain substrates. Holders for more than two substrates are within the scope of the invention, but the number of substrates for efficient diamond formation generally corresponds to a filament length up to about 20 cm., since otherwise the length of the filament and the voltage drop therein become so great that parallel plasma paths may be encountered. Most often, each holder contains from 1 to 6 substrates.

Also within the scope of the invention is the employment of a plurality of parallel vertical or horizontal substrate holders, with one or more filaments adjacent to each holder. Said holders are typically spaced about 2-5 mm. apart for the sake of efficient gas circulation.

A typical substrate 5 is an approximately 20-60 mm. square and has a thickness of about 3-5 mm., although it is within the scope of the invention to employ substrates of other shapes and sizes. For example, circular substrates may be employed to minimize cracking at the expense of yield of diamond articles. However, the substrate is most often rectangular and preferably square.

For a 25-mm. square substrate with a thickness of 3.2 mm., a typical holder will have a length of about 100 mm., a width of about 40–45 mm. and a thickness of about 9–10 mm. These dimensions are not critical and those skilled in the art will be able to determine suitable dimensions for substrates of these and other sizes.

As shown in the drawings, recesses 3 in the substrate holder are of a size to accommodate substrates 5 snugly. In a preferred embodiment of the invention, rectangular substrates and recesses have rounded corners illustrated by 7, typically on radii of about 3-5 mm. The depths of recesses 3 are such that the surfaces of substrates 5 are flush with surface 9 of substrate holder 1.

The substrate holder comprises graphite, which can easily be worked, as by extrusion or machining from preformed flat plates in admixture with a binder such as pitch, into substrate holder shapes. Following working, any binder and other volatiles may be burned off.

Graphite is employed because of its particular effectiveness in releasing any diamond deposited thereon. A disadvantage of graphite, however, is that it is subject to etching by atomic hydrogen present in the CVD diamond-forming gas mixture. Such etching may be suppressed by providing a coating on the substrate holder, at least in part and typically including surface 9. Said coating preferably comprises a tie-layer, typically of titanium, followed by a hydride-forming metal such as niobium, zirconium, hafnium, vanadium, tantalum, palladium or an alloy of any of these, with niobium generally being preferred.

The layer of hydride-forming metal may be deposited on the substrate holder by conventional means such as sputtering. Its thickness is typically about 1-2 microns. A secondary advantage of its presence is that any diamond which deposits on the coated graphite peels off easily and can easily be separated from the main sheet of diamond which grows on the substrate.

Substrate 5 may be of any material which can accept and then easily release a sheet of CVD diamond. Typical art-recognized substrate materials are boron, boron nitride, platinum, molybdenum, copper, aluminum nitride, silver, iron, nickel, silicon, alumina and silica, as well as combinations of any of these. Among these materials, molybdenum is often preferred.

It is also often preferred to coat the substrate with one of the hydride-forming metals disclosed hereinabove, in accordance with copending, commonly owned application Ser. No. 07/806,388, to facilitate separation of the diamond sheet therefrom. The substrate may be entirely of hydride-forming metal, but this is generally not advisable since the coefficients of thermal expansion of such metals are substantially different from that of diamond.

The present invention has been employed with molybdenum substrates 25 mm. square having corners rounded on 3.2-mm. centers, using both uncoated and niobium-sputtered graphite holders. In the latter case, the diamond sheets formed on the substrates separated cleanly therefrom without cracking and also separated cleanly from diamond which formed on the surfaces of the holders.

With uncoated holders, the diamond which formed on the surface of the holder was prematurely released therefrom during deposition but remained integral with the diamond formed on the substrate, and thus sagged closer to the filaments at the edges. Since its temperature rose above that of the substrate and holder, and since it was exposed to reactive gases on both sides, its growth rate was increased and it tended to grow toward the filament with the possibility of contact therewith, resulting in arc formation and filament destruction.

To avoid this phenomenon, certain geometrical parameters may be preferred under such conditions. Thus, for deposition apparatus having vertical filaments the vertical distances between the horizontal substrate edges ($w_2$ in FIG. 1) and between said edges and the horizontal edges of the substrate holder ($w_1$ and $w_3$) should be less than the distance between the substrate surface and the filament. Similarly, the horizontal distances between the vertical substrate edges and the vertical edges of the substrate holder should be such that there is no contact between the filament and any diamond peeling from the holder.

What is claimed is:

1. Apparatus for receiving diamond produced by chemical vapor deposition, said apparatus comprising:
    at least one substrate holder comprising graphite, said substrate holder having at least one recess adapted to hold a substrate such that the surface of said substrate is flush with the surface of said holder surrounding said recess; and
    at least one substrate mounted in said recess, said substrate comprising a material effective to receive and subsequently release a layer of diamond, said material being selected from the group consisting of boron, boron nitride, platinum, molybdenum, copper, aluminum nitride, silver, copper, iron, nickel, silicon, alumina, silica and combinations thereof.

2. Apparatus according to claim 1 wherein the substrates are rectangular.

3. Apparatus according to claim 1 wherein the substrates are square.

4. Apparatus according to claim 2 wherein the substrates and recesses have rounded corners.

5. Apparatus according to claim 4 wherein said corners are rounded on radii of about 3-5 mm.

6. Apparatus according to claim 1 for holding from 1 to 6 substrates.

7. Apparatus according to claim 1 wherein said substrate holder is coated at least in part with a tie-layer followed by a hydride-forming metal.

8. Apparatus according to claim 7 wherein the tie-layer is titanium and the metal is niobium.

9. Apparatus according to claim 1 wherein the substrates are molybdenum.

10. Apparatus according to claim 1 also including at least one filament parallel to the surface of said substrate holder.

11. Apparatus according to claim 10 wherein said filament is vertical.

12. Apparatus according to claim 11 wherein said filament is horizontal.

13. Apparatus according to claim 11 wherein the vertical distances between the horizontal substrate edges in a holder and between said edges and the horizontal edges of the holder are less than the distance between the substrate surface and the filament, and the horizontal distances between the vertical substrate edges and the vertical edges of the substrate holder are such that there is no contact between the filament and any diamond peeling from the holder.

* * * * *